United States Patent
Petersen et al.

Patent Number: 5,699,510
Date of Patent: Dec. 16, 1997

[54] FAILURE DETECTION SYSTEM FOR A MIRRORED MEMORY DUAL CONTROLLER DISK STORAGE SYSTEM

[75] Inventors: Mark D. Petersen; Barry J. Oldfield, both of Boise, Id.

[73] Assignee: Hewlett-Packard Company, Palo Alto, Calif.

[21] Appl. No.: 657,714

[22] Filed: May 30, 1996

Related U.S. Application Data

[63] Continuation of Ser. No. 357,617, Dec. 15, 1994, abandoned.

[51] Int. Cl.$^6$ ............................................. G06F 11/00
[52] U.S. Cl. ........................ 395/185.07; 395/183.18; 395/182.04; 395/182.07
[58] Field of Search ................. 395/183.13, 183.18, 395/182.04, 182.05, 182.07, 185.01, 185.07

[56] References Cited

U.S. PATENT DOCUMENTS

| | | | |
|---|---|---|---|
| 4,339,804 | 7/1982 | Davison et al. | 364/900 |
| 4,958,273 | 9/1990 | Anderson et al. | 364/200 |
| 5,155,835 | 10/1992 | Belsan | 395/425 |
| 5,155,845 | 10/1992 | Beal et al. | 395/182.04 |
| 5,193,154 | 3/1993 | Kitajima et al. | 395/182.04 |
| 5,195,100 | 3/1993 | Katz et al. | 371/66 |
| 5,204,952 | 4/1993 | Ayers et al. | 395/550 |
| 5,212,784 | 5/1993 | Sparks et al. | 395/182.04 |
| 5,212,785 | 5/1993 | Powers et al. | 395/182.03 |
| 5,226,151 | 7/1993 | Takida et al. | 395/182.03 |
| 5,237,658 | 8/1993 | Walker et al. | 395/200 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,291,494 | 3/1994 | Bruckert et al. | 395/182.22 |
| 5,297,258 | 3/1994 | Hale et al. | 395/275 |
| 5,361,347 | 11/1994 | Glider et al. | 395/575 |
| 5,379,415 | 1/1995 | Papenberg et al. | 395/182.03 |
| 5,388,254 | 2/1995 | Betz et al. | 395/185.08 |
| 5,418,921 | 5/1995 | Cortney et al. | 395/425 |
| 5,437,022 | 7/1995 | Beardsley et al. | 395/182.04 |
| 5,459,857 | 10/1995 | Ludlam et al. | 395/182.04 |

*Primary Examiner*—Hoa T. Nguyen
*Assistant Examiner*—Joseph E. Palys
*Attorney, Agent, or Firm*—Lane R. Simmons

[57] ABSTRACT

In a disk storage system having dual controllers and mirrored memory therebetween, arbitration logic associated with each controller generates state transition signals to identify the mirrored memory access status for the controller generating the signal. Each arbitration logic also monitors the state transition signals of the other. A failure in the mirrored memory system between the dual controllers is detected by one controller sensing an incorrect state transition signal communicated from the other controller. A failure is also detected by one controller not sensing a state transition signal from the other within a specified timeout period. Memory refresh cycles are tapped to cause the arbitration logic to cycle through state transition signals thereby forcing each controller to attempt a mirrored memory access on a regular basis whereby a memory system failure may be detected.

18 Claims, 4 Drawing Sheets

FAILURE DETECTION SYSTEM FOR A MIRRORED MEMORY DUAL CONTROLLER DISK STORAGE SYSTEM

CROSS REFERENCE TO RELATED APPLICATION

This is a continuation of application Ser. No. 08/357,617 filed on Dec. 15, 1994, now abandoned.

FIELD OF THE INVENTION

This invention relates, in general, to computer disk storage controllers and, more particularly, to a system and method for detecting controller failure in a mirrored memory multiple controller disk storage system.

BACKGROUND OF THE INVENTION

In high reliability computer disk storage systems, there is a desire to have redundancy in all the physical parts which make up a subsystem to reduce the potential for loss of data and down time upon failure of a part. The use of dual disk storage controllers, each having its own memory, provides several major benefits to a disk storage system. For example, (1) a redundancy of storage information is retained to allow for recovery in the case of failure or loss of one controller or its memory; (2) recovery from a disabled controller is feasible due to the failover capabilities of the secondary controller; and (3) greater system up time is achieved through the secondary controller being available.

With the desire for more performance out of these redundant subsystems, caching and the use of memory as temporary storage has become commonplace. The means by which these duplicate physical memories are kept in synchronization can be difficult. Some disk systems use a latent (delayed or massive update) process to create this duplication, but that approach tends to degrade performance and is very complex to manage. Another approach (the one used in this invention) is to form a real time mirrored memory process to create and retain accurate this duplication of data. The use of real time, synchronized, redundant memory (mirrored memory) in dual controllers can improve speed and accuracy in the case of a failover from one controller to the other.

However, this use of redundant memory makes the problem of providing multiple disk storage controller solutions substantially more difficult. Exemplary of the significant problems to overcome include how to effectively and reliably (1) detect controller failure early on in the context of mirrored memory processing so as to reduce potential problems that may occur from a later discovery of failure; (2) detect controller failure without significant hardware and/or software overhead requirements; and (3) detect controller failure to separate the controllers and discontinue mirroring of their memories without loss of processing operations and capabilities.

Given the foregoing problems associated with controller failure detection in a multiple controller disk storage system, and other problems not addressed herein, it has not generally been taught in the prior art to use mirrored memory between controllers in a multiple controller system.

Accordingly, objects of the present invention are to provide an effective and reliable controller failure detection system for real time, synchronous, mirrored memory controllers in a dual controller disk storage system.

SUMMARY OF THE INVENTION

According to principles of the present invention in its preferred embodiment, in a disk storage system having dual controllers and mirrored memory, arbitration logic associated with each controller generates state transition signals to identify a mirrored memory access status for the controller generating the signal. Each arbitration logic also monitors the state transition signals of the other. A failure in the mirrored memory system between the dual controllers is detected by one controller sensing an incorrect state transition signal communicated from the other controller. A failure is also detected by one controller not sensing a state transition signal from the other within a specified timeout period.

According to further principles of the present invention, memory refresh cycles are tapped to cause the arbitration logic to cycle through state transition signals thereby forcing each controller to attempt a mirrored memory access on a regular basis whereby a memory system failure may be detected. Consequently, in cases where controller memory access may not occur often, such as with a slave controller in a master/slave context, memory system failures are detected earlier rather than later due to the constant arbitration between controllers for memory access at refresh.

With the failure detection system and method of the present invention, controller and mirrored memory reliability is increased. Other objects, advantages, and capabilities of the present invention will become more apparent as the description proceeds.

DETAILED DESCRIPTION OF THE INVENTION

Figure 1:
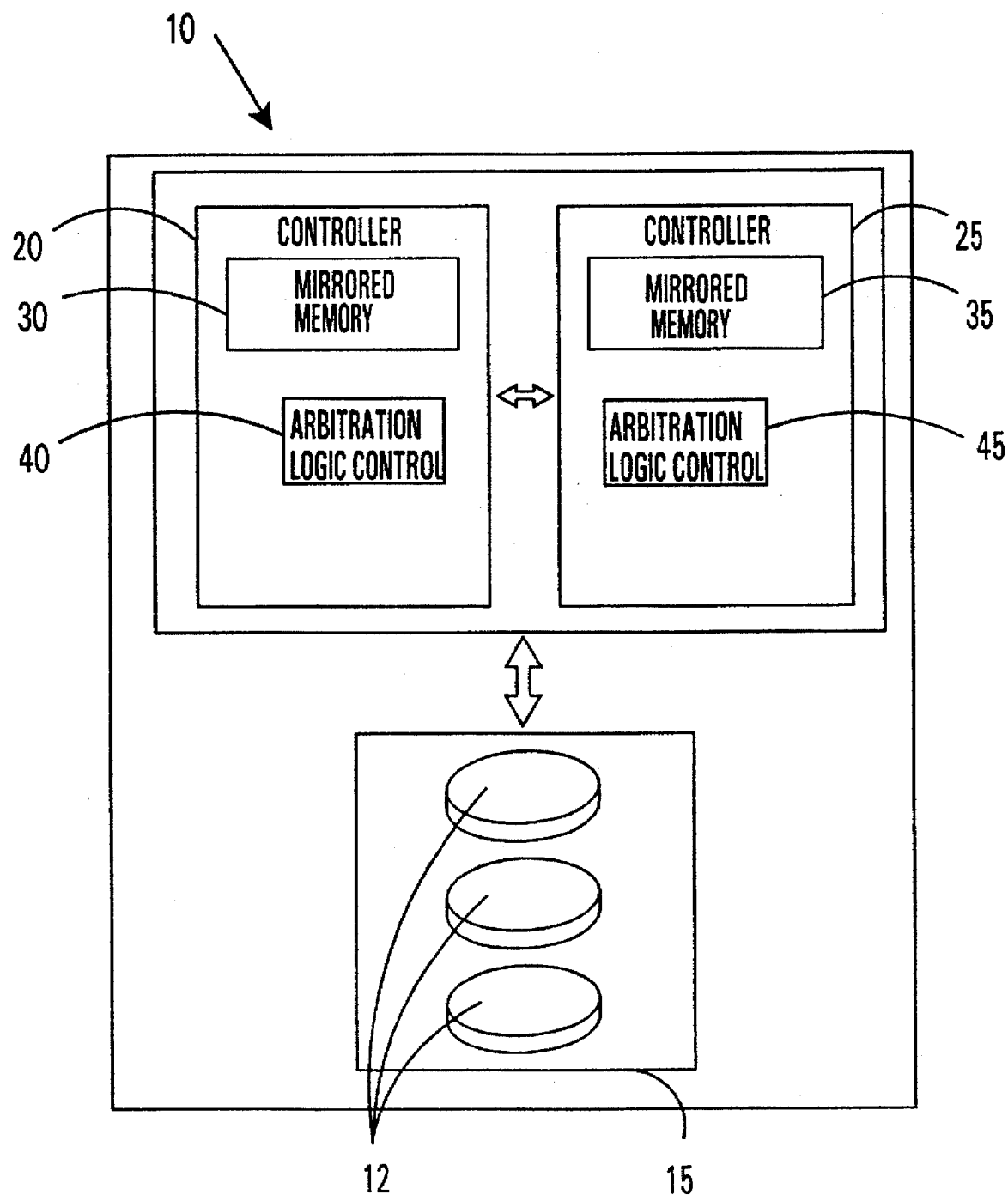
FIG. 1 is a block diagram representing an overview of the present invention system for detecting controller failure in a dual controller disk storage system having mirrored memory therebetween.

FIG. 1 is a block diagram representing an overview of the present invention system for detecting mirrored memory system controller failure in a dual controller disk storage system 10. Disk storage control system 10 includes disk storage subsystem 15 having disk storage devices 12 therein and dual disk storage controllers 20 and 25. Controllers 20 and 25 each have memory 30 and 35, respectively.

Although most any type of Random Access Memory (RAM) is suitable for use as memory 30 and 35, in the preferred embodiment a non-volatile RAM (or volatile RAM made non-volatile by use of a power supply backup) is used to allow for retention of data in the event of a power failure. Moreover, although only dual controllers 20 and 25 are shown in the diagram and discussed generally herein, it will be obvious that the principles expressed and implied herein are likewise applicable in other multiple controller environments, i.e., more than two controllers.

Each memory 30 and 35 is a mirrored memory. As is well known in the art, mirrored memory simply means that data in one memory is duplicated or "mirrored" in another memory. As used in the present invention, mirrored memory means that data in the memory of one controller is duplicated or "mirrored" in the memory of the other controller.

The existence of dual controllers, and mirrored memory in each, provides a fault tolerant environment for disk storage system 10. Namely, in the event of a failure of one of the controllers, or one of the controller memory systems, the existence of the other controller and its mirrored memory provides a seamless failover option for continued processing. In this context, communication occurs between controllers 20 and 25 to provide a cost effective real time link and to allow each controller to monitor the state of the duplicate controller and to coordinate activities.

In the preferred embodiment, the mirrored memory is a real time mirrored memory, i.e., a single microprocessor or direct memory access updates data into or retrieves data from both memories 30 and 35 at substantially the same time. Arbitration logic 40 and 45 controls when each controller is granted access to update or retrieve data from the mirrored memory. Arbitration logic 40 and 45 communicate with each other so that each knows which controller has current access to the memories. Each arbitration logic generates state transition signals to identify a mirrored memory access status for the controller generating the signal. Each arbitration logic also monitors the state transition signals of the other. Accordingly, a failure in the mirrored memory system between the dual controllers is detected by one controller sensing an incorrect state transition signal communicated from the other controller or by one controller not sensing a state transition signal from the other within a specified timeout period.

In the preferred embodiment, arbitration logic 40 and 45 also only allow one controller to access the memories at a single time. For example, when controller 20 is granted access to memory 30, it is likewise granted access to memory 35, and controller 25 is disallowed access to either memory. Arbitration logic 40 and 45 control simultaneous access by communicating together to enable and/or disable appropriate signal lines in each controller.

Given that one of the key purposes of a dual controller configuration is to allow for the capability of immediate failover from one controller to the other in the event of a failure of one of the controllers, it is imperative that the memory contents of each controller be identical before a controller failover occurs so that operation will continue uninterrupted. Likewise, it is imperative that a controller failure be detected early on in the processing scheme so that the mirroring of the memory can be disabled and the data integrity of the memory of at least the non-failing controller remain reliable for continued system operation. Accordingly, the present invention focuses on early detection of a controller failure in a multiple controller configuration by using, as a key element, arbitration logic 40 and 45 to communicate and control mirrored memory access status between controllers 20 and 25.

Figure 2:
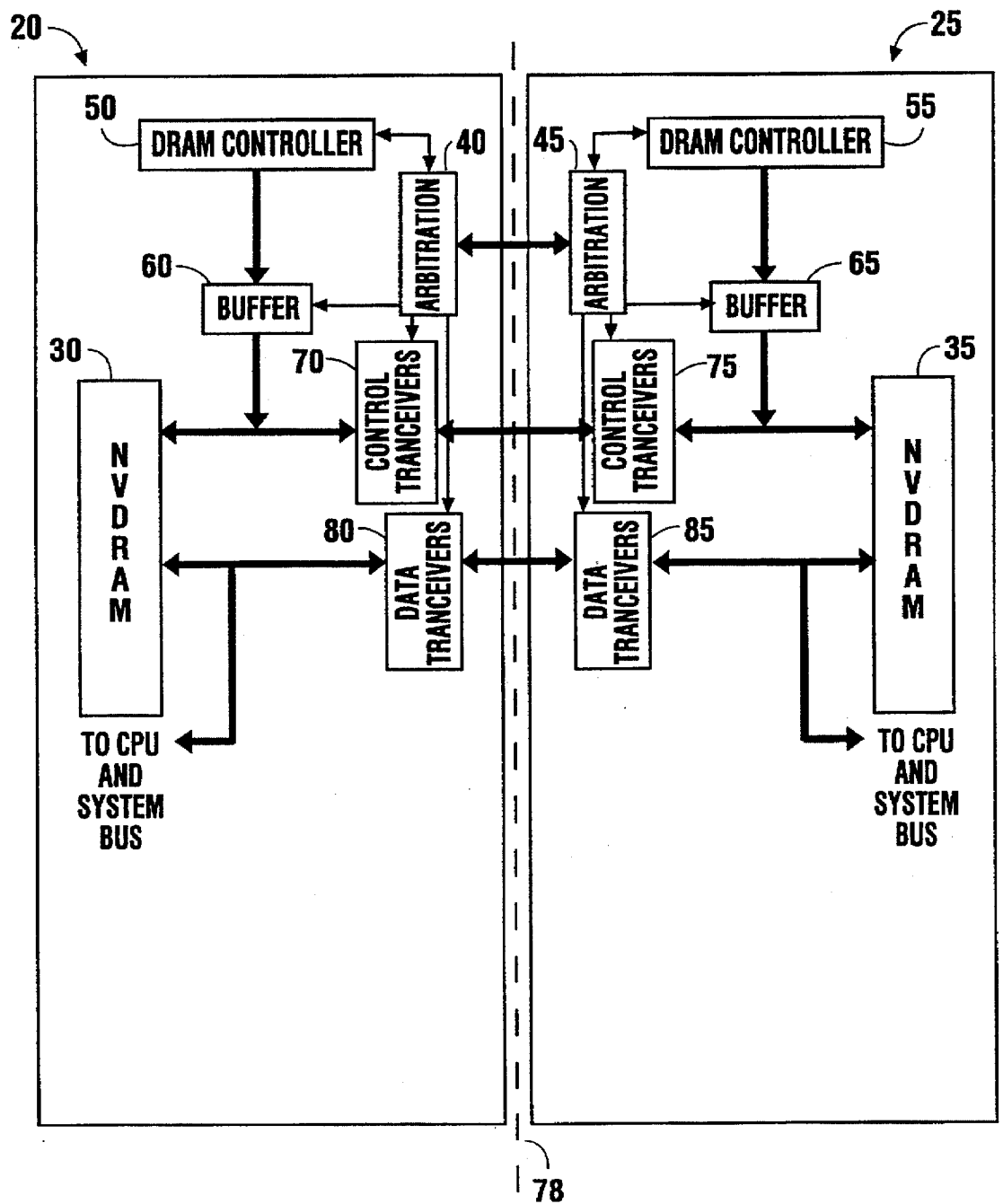
FIG. 2 is a schematic block diagram of the present invention.

Referring now to FIG. 2, a more detailed schematic block diagram of the present invention system is shown. Similar components between figures retain similar reference numbers. Accordingly, each controller 20 and 25 is referenced generally, each mirrored memory 30 and 35 is referenced as Non-Volatile Dynamic Random Access Memory (NVDRAM) as used in the preferred embodiment, and arbitration logic 40 and 45 are likewise referenced as in FIG. 1. For simplicity purposes, NVDRAM controllers 50 and 55 will be referred to herein as DRAM controllers. All directional arrows indicate paths of communication and/or transfer of data.

Each DRAM controller 50 and 55 has its own internal clock (not shown) for governing its respective circuitry and for purposes such as initiating a request for memory refresh. Likewise, each arbitration logic 40 and 45 has its own internal clock whereby a response timeout may be detected when state transition signals are communicated from one arbitration logic to the other. As previously mentioned in reference to FIG. 1, arbitration logic 40 and 45 control which controller is granted access to the memories 30 and 35, and which controller is disabled from accessing the same. As such, arbitration logic 40 and 45 communicate with each other via state transition signals and, respectively, communicate with certain local memory system control means, including DRAM controllers 50 and 55, buffers 60 and 65, control transceivers 70 and 75, and data transceivers 80 and 85.

As common in the art, DRAM controllers 50 and 55 manage and generate timing and control logic signals, such as Row Address Strobe (RAS), Column Address Strobe (CAS), Write Enable (WE), Output Enable (OE), etc., for accessing appropriate addresses in DRAM 30 and 35, respectively. Buffers 60 and 65 are DRAM controller buffers for enabling and/or disabling each DRAM controller 50 and 55 with respect to accessing DRAM 30 and 35, respectively.

Control transceivers 70 and 75 are bi-directional transceiver buffers for a local controller (i.e., the controller on which the transceiver resides) to (1) drive address signals to a backplane 78 of the computer system to access the other (remote) controller's memory, or (2) receive address signals from the remote controller through the backplane to access the local controller's memory. Likewise, data transceivers 80 and 85 are bi-directional transceiver buffers for a local controller to (1) drive data signals to the backplane 78 to send to the remote controller, or (2) receive data signals from the remote controller through the backplane.

Each DRAM controller 50 and 55 is configured to refresh the memory (DRAM 30 and 35, respectively) at a refresh interval determined by each DRAM controller's own independently executing clock timer. These memory refresh cycles are used as a means to cause each arbitration logic to cycle through state transition signals thereby forcing each controller to attempt a mirrored memory access, i.e., an access to the memory residing on the local and remote controller, on a reliably consistent basis whereby a memory system failure may be detected. This system and method affords reliability in any dual controller relationship, such as master/master (peer/peer) or master/slave. It is especially valuable in a master/slave controller relationship because a slave controller may not access the mirrored memory often and, therefore, would not detect whether the remote controller has failed until a later potentially detrimental time.

When a memory access cycle (read, write, or refresh) is signaled to occur by a DRAM controller 50 or 55, that signal is communicated to its local arbitration logic 40 or 45. If that local controller does not currently have mirrored memory access, the local arbitration logic communicates a state transition signal requesting mirrored memory access to the other (remote) controller. The state transition signal identifies the mirrored memory access status of the (local) controller communicating the signal. For example, in this instance, a state transition signal requesting memory access is communicated to the remote arbitration logic. Responsively, the remote controller that currently has mirrored memory access senses the requesting state transition signal and replies with a responsive state transition signal for granting the requesting controller access to the mirrored memory. The responsive state transition signal occurs after the remote controller completes its own mirrored memory access if such is occurring when the request is received.

As soon as the local arbitration logic communicates the memory request, it initiates its own timer to clock a timeout period. If the remote controller does not respond within the predetermined interval of time, i.e., the timeout period, the local controller recognizes that a failure has occurred with the remote controller memory system.

A remote controller memory system failure is also detected upon the sensing by the local controller of an incorrect state transition signal communicated from the remote controller. For example, if the local controller is expecting to receive a state transition signal granting it access to the mirrored memory but instead receives some other state transition signal from the remote controller, the local controller recognizes that a failure has occurred.

By way of these state transition signals and in conjunction with the timeout interval, each controller (1) communicates its own mirrored memory access status, (2) senses the status of the other controller, and/or (3) senses whether an appropriate status signal is communicated. Furthermore, memory refresh cycles are tapped to force arbitrary cycling through the state transition signals whereby mirrored memory is accessed on a regular basis to provide for a consistent and reliable means for failure detection in the memory system.

Figure 3:
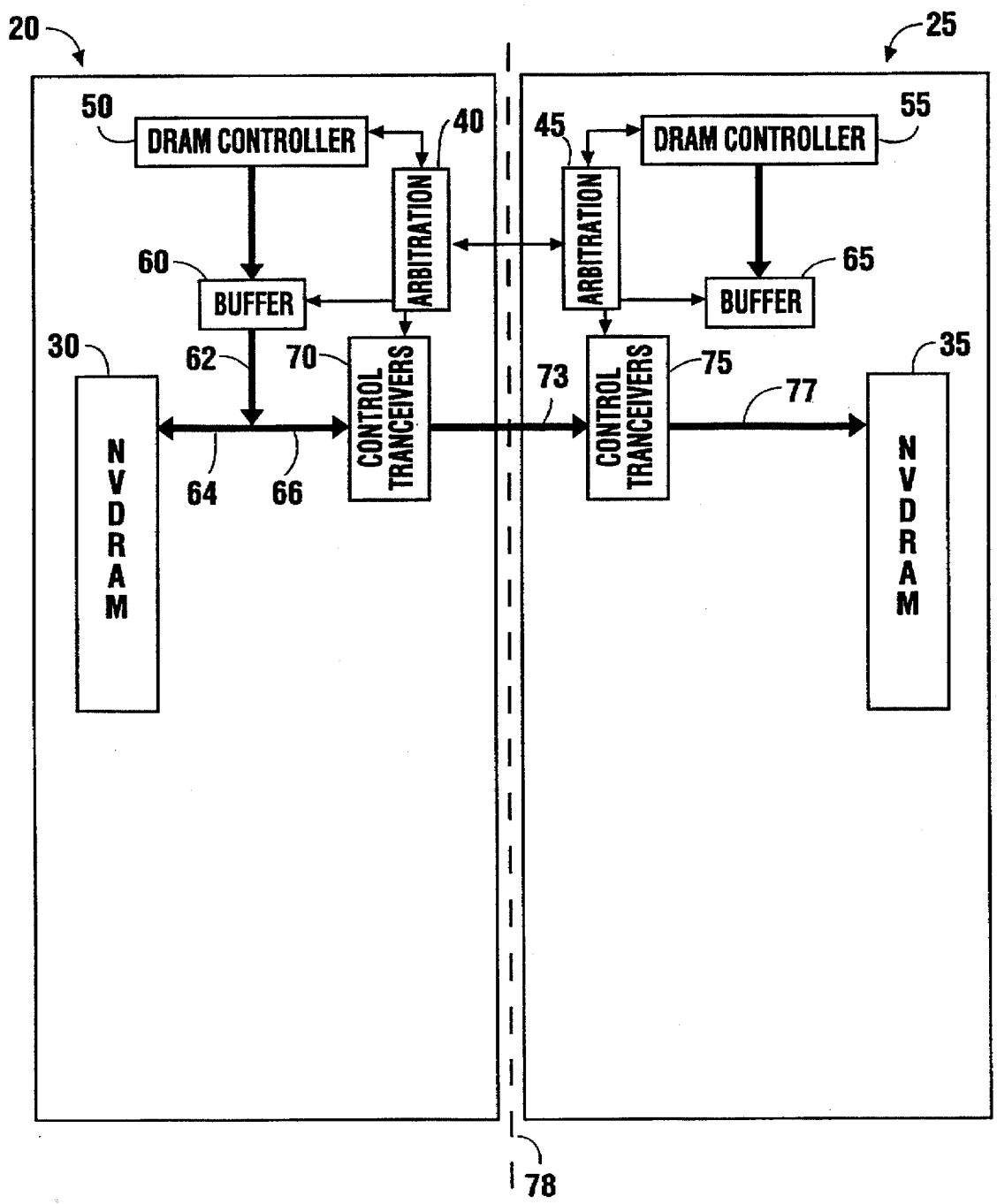
FIG. 3 is the schematic block diagram of FIG. 2 wherein unidirectional paths of communication are depicted for detecting controller failure during a refresh cycle of mirrored memory according to principles of the present invention.

Operation of FIG. 2 is best demonstrated by the example as shown in FIG. 3. FIG. 3 is the same as FIG. 2 except that the bi-directional arrows of FIG. 2 are substituted in FIG. 3 with uni-directional arrows depicting the actual directional paths of communication during a refresh of mirrored memory by controller 20. Although this depiction and discussion associated therewith exemplifies the state transition signals generated by the arbitration logic during a memory refresh cycle, it is understood that such state transition signals also occur during other memory access transactions, such as a read or write.

In the event that controller 20 initiates a request for memory refresh, DRAM controller 50 asserts a request signal to its own arbitration logic 40. If controller 20 does not already have access to the mirrored memory, arbitration logic 40 enters a Request state and communicates such state transition signal to arbitration logic 45 of controller 25. A Request state is when the local arbitration logic 40 (in this example) waits for the remote arbitration logic 45 to grant controller 20 access to remote DRAM 35.

If DRAM controller 55 is accessing the mirrored memory when arbitration logic 45 senses the Request state transition signal as communicated from arbitration logic 40, then DRAM controller 55 will complete its cycle for using the memory (either for reading, writing, or refresh) and remove its own Request to arbitration logic 45. Arbitration logic 45 then communicates a state transition signal granting memory access to arbitration logic 40 and, subsequently, enters into a Slave state. Upon entering the Slave state, arbitration logic 45 disables DRAM controller buffer 65 (as shown by the depiction that no directional arrow proceeds out from, i.e., points away from, buffer 65). Arbitration logic 45 also sets control transceivers 75 to drive address signals from backplane 78 to DRAM 35 (as shown by directional arrows 73 and 77).

Arbitration logic 40 acknowledges this by entering into a Master state wherein controller 20 is allowed access to both memories 30 and 35. Arbitration logic 40 enables its local DRAM controller buffer 60 (as shown by directional arrow 62), and sets control transceivers 70 to drive from controller 20 to backplane 78 (as shown by directional arrow 73).

Next, DRAM controller 50 performs a DRAM refresh cycle by asserting CAS and RAS to access its own DRAM 30 (as shown by directional arrow 64) and by asserting the same through control transceivers 70 and 75 to access DRAM 35 of controller 20 (as shown by directional arrows 66, 73 and 77). Consequently, DRAM 30 and 35 are refreshed substantially simultaneously.

Figure 4:
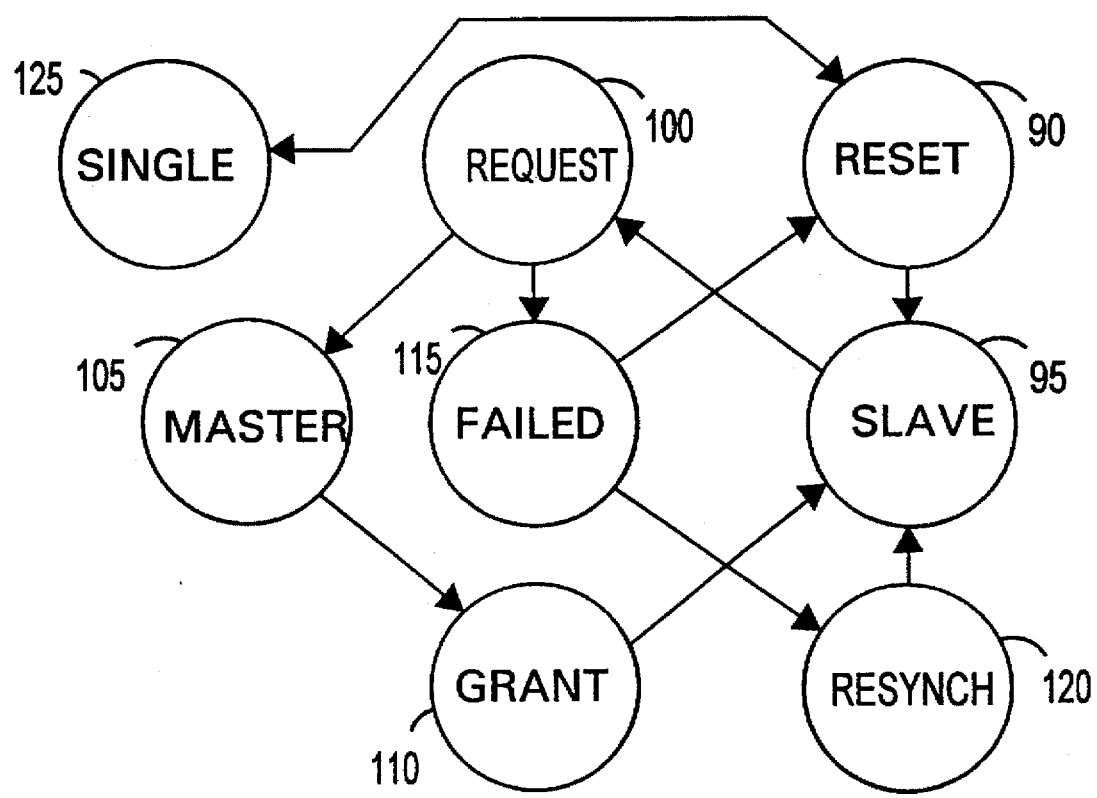
FIG. 4 is an arbitration logic state transition diagram reflecting the memory access status states for each controller.

Referring now to FIG. 4, an arbitration logic state transition diagram is depicted reflecting the memory access status states for each controller in a master/slave relationship. As previously discussed, arbitration logic 40 and 45 (FIGS. 1–3) control operation of the mirroring of the memories 30 and 35 through communication and sensing of state transition signals. The arbitration logic also controls the output enables and direction selection of all buffers and transceivers connected to the memory system. As such, only one controller is granted the ability to access both the local and remote banks of DRAM at a single time. The other controller cannot access either memory until the arbitration logic cycles through appropriate transition states at such times as during a memory refresh cycle or some other read/write operation. As the arbitration logic transitions through its various states, it sends its current state to the remote controller and, likewise, monitors the state transition signals of the remote arbitration logic. This allows either set of logic to detect a fault in the other.

It is understood that a variety of transition states may exist and not all transition states are shown in the depiction of FIG. 4. However, some of the various states as used in the preferred embodiment and shown in FIG. 4 are described as follows:

RESET: While the reset line is asserted on the controller board, the arbitration logic remains in the Reset state, 90. In this state the local control and data backplane transceivers (70, 75, 80, and 85 of FIG. 1) are disabled as is the local DRAM controller (50 and 55). Once reset is released the arbitration logic enters the Slave state.

SLAVE: While in the Slave state, 95, the local control backplane transceivers are pointed at the local DRAM, and the local DRAM controller buffer (60 or 65) is disabled. The local data backplane transceivers are set according to the operation being performed (read or write). When a request for memory access from the local DRAM controller is received by the local arbitration logic, the local arbitration logic enters the Request state to be able to access the memories.

REQUEST: The local arbitration logic timer is started when the Request state 100 is first entered. While in this state, the Request state transition signal is communicated to the remote arbitration logic, and the local arbitration logic waits for the remote arbitration logic to grant the local controller access to the remote DRAM. The local backplane transceivers and DRAM controller are set the same way as in the Slave state. If the timer signals a timeout interval before access to the remote DRAM is granted by the remote arbitration logic, the local arbitration logic enters the Failed state. If access is granted, the local arbitration logic enters the Master state.

MASTER: When in the Master state, 105, access is granted to both banks of DRAM, 30 and 35. The local control backplane transceivers are pointed toward the remote board and the local DRAM controller buffer (60 or 65) is enabled. The data backplane transceivers are set according to the operation being performed (read or write). The arbitration logic remains in this state until a Request from the remote board is detected and the request line from the local DRAM controller is de-asserted. This state is entered after the remote controller has entered the Slave state.

GRANT: The local arbitration logic enters the Grant state 110 when it detects that the remote controller is requesting the mirror interface. The local arbitration logic will wait in this state until the local DRAM controller has finished its current memory access and de-asserted its request line.

FAILED: The Failed state 115 is entered when (1) the bus is not granted within the timeout period as monitored by the clock in the local arbitration logic, or (2) an illegal transition state is detected on the remote controller. The arbitration logic remains in this state until the local controller is reset, after which the Reset state is entered, or the remote arbitration logic enters the Reset state, after which the Resynch state is entered. While in this state both backplane transceivers are disabled and the DRAM controller buffer is enabled.

RESYNCH: The Resynch state 120 is entered any time the local arbitration logic detects that the remote arbitration logic has entered the Reset state. A timer is started whenever this state is entered. The arbitration logic will remain in this state until the remote arbitration logic leaves the Reset state or the timeout interval completes. If the timeout interval completes, the Failed state is entered. The Slave state is entered if the remote controller leaves the Reset state before the timeout interval completes. While in this state both backplane transceivers are disabled and the DRAM controller buffer is enabled.

SINGLE: The Single state 125 is entered any time the presence of a second controller is not detected or if the controllers are to remain in an "Isolation mode", i.e., a non-memory mirroring state. The arbitration logic remains in this state as long as one of these two conditions exists or a controller reset is detected. In all cases, a Reset state will be the next state. While in this state, both backplane transceivers are disabled and the DRAM controller buffer is enabled.

What has been described above are the preferred embodiments for a system and method for detecting controller failure in a dual controller disk storage system having mirrored memory therebetween. It is clear that the present invention offers a powerful tool for providing a cost effective, real time link between controllers, and allows each controller to monitor the state of the other, and allows each controllers' activities to be coordinated for failure detection. Moreover, it will be obvious to one of ordinary skill in the art that the present invention is easily implemented utilizing any of a variety of hardware and software tools existing in the art. While the present invention has been described by reference to specific embodiments, it will be obvious that other alternative embodiments and methods of implementation or modification may be employed without departing from the true spirit and scope of the invention.

What is claimed is:

1. A failure detection system for a computer disk storage control system having a plurality of controllers, comprising:
    (a) real-time mirrored memory on each controller with respect to each other controller;
    (b) means for communicating a first state transition signal by a first controller of the plurality of controllers to a second controller of the plurality of controllers at least upon each event of a memory refresh cycle of the first controller, wherein the first state transition signal identifies a mirrored memory access status of the first controller;
    (c) means for timing a predetermined interval of time in connection with and beginning concurrently with the communication of the first state transition signal from the first controller to the second controller; and,
    (d) means for sensing one of:
        (i) a second state transition signal communicated from the second controller to the first controller in response to the first state transition signal, wherein the second state transition signal identifies a valid mirrored memory access status or a failure of the second controller; and,
        (ii) a completion of the interval of time indicative of a failure of the second controller.

2. The failure detection system of claim 1 wherein the first state transition signal is a signal indicative of a request for access to the mirrored memory of each controller.

3. The failure detection system of claim 1 further comprising means for communicating the first state transition signal upon an event of a memory access cycle.

4. The failure detection system of claim I wherein the second state transition signal is a signal indicative of a granting of access to the mirrored memory to the first controller, and whereby the second controller is denied access to the mirrored memory.

5. The failure detection system of claim 1 wherein the second state transition signal is an incorrect state transition signal relative to what the first controller expects in response to the first state transition signal communicated, whereby failure of the second controller is detected by the first controller due to the incorrect state transition signal.

6. The failure detection system of claim 1 wherein the second state transition signal is communicated from the second controller to the first controller upon sensing the first state transition signal.

7. The failure detection system of claim 1 wherein the state transition signals include signals indicative of a local controller memory access status, selected from the group consisting of:
    (a) being a slave, wherein access to the memory is disallowed;
    (b) requesting access to the memory;
    (c) being a master, wherein access to the memory is allowed;
    (d) granting memory access to a remote controller;
    (e) failing to being granted access to the memory by a remote controller;
    (f) resetting its circuitry;
    (g) resynchronizing its circuitry with a remote controller; and,
    (h) isolating communication from a remote controller.

8. The failure detection system of claim 1 further including control means on each controller for controlling access to the mirrored memory of the controller on which the control means resides, and wherein the control is based on the state transition signals generated.

9. The failure detection system of claim 8 wherein the control means includes a memory controller, buffers, and transceivers for enabling, disabling, and selecting flow direction of memory address and data signals.

10. A method of detecting a memory system failure in a computer disk storage control system having first and second disk controllers and real-time mirrored memory therebetween, comprising the steps of:
    (a) the first controller communicating a first state transition signal to the second controller at least upon each event of a memory refresh cycle of the first controller, wherein the first state transition signal identifies a mirrored memory access status of the first controller;

(b) the first controller starting a timer concurrently with the communication of the first state transition signal for timing a predetermined interval of time; and, (c) the first controller sensing one of:
(i) a second state transition signal communicated from the second controller to the first controller in response to the first state transition signal, wherein the second state transition signal identifies a valid mirrored memory access status or a failure of the second controller; and,
(ii) a completion of the interval of time indicative of a failure of the second controller memory system.

11. The method according to claim 10 wherein the first state transition signal indicates a request for access to the mirrored memory.

12. The method according to claim 10 wherein the first state transition signal is communicated upon an event of a memory access cycle.

13. The method according to claim 10 wherein the second state transition signal grants access to the mirrored memory to the first controller, and whereby the second controller is denied access to the mirrored memory.

14. The method according to claim 10 wherein the second state transition signal is an incorrect state transition signal relative to what the first controller expects in response to the first state transition signal communicated, whereby failure of the second controller memory system is detected by the first controller due to the incorrect state transition signal.

15. The method according to claim 10 wherein the second state transition signal is communicated upon sensing the first state transition signal.

16. The method according to claim 10 wherein the state transition signals include signals indicative of a local controller memory access status, selected from the group consisting of:

(a) being a slave, wherein access to the memory is disallowed;

(b) requesting access to the memory;

(c) being a master, wherein access to the memory is allowed;

(d) granting memory access to a remote controller;

(e) failing to being granted access to the memory by a remote controller;

(f) resetting its circuitry;

(g) resynchronizing its circuitry with a remote controller; and, (h) isolating communication from a remote controller.

17. The method according to claim 10 further including the step of controlling access to the mirrored memory by the controller on which the memory resides based on the state transition signals generated.

18. The method according to claim 17 wherein the step of controlling access includes signaling a memory controller, buffers, and transceivers for enabling, disabling, and selecting flow direction of memory address and data signals.

* * * * *